United States Patent [19]
Llewellyn

[11] Patent Number: 5,302,915
[45] Date of Patent: Apr. 12, 1994

[54] UNITY-GAIN, WIDE BANDWIDTH, BIPOLAR VOLTAGE FOLLOWER WITH A VERY LOW INPUT CURRENT

[75] Inventor: William D. Llewellyn, San Jose, Calif.

[73] Assignee: National Semiconductor Corporation, Santa Clara, Calif.

[21] Appl. No.: 11,359

[22] Filed: Jan. 29, 1993

[51] Int. Cl.[5] .............................................. H03F 1/56
[52] U.S. Cl. .................................... 330/296; 330/288; 330/310
[58] Field of Search ............... 330/288, 296, 299, 310, 330/311

[56] References Cited
FOREIGN PATENT DOCUMENTS
4-079407 3/1992 Japan ..................................... 330/296

Primary Examiner—James B. Mullins
Attorney, Agent, or Firm—Limbach & Limbach

[57] ABSTRACT

A voltage-follower circuit has an input biasing stage that generates an input stage bias current and a tracking bias current. An input stage generates an intermediate voltage signal and sources an input current in response to an input voltage signal and the input stage bias current. An output biasing stage generates an output bias current. An output biasing stage generates an output voltage signal and sinks a portion of the input bias current in response to the intermediate voltage signal and the output bias current. A cancellation stage sinks substantially all of the input current in response to the tracking bias current. A cascode stage isolates the input biasing stage from the input stage and the cancellation stage. A compensation stage sinks a portion of the tracking bias current which is substantially equivalent to the portion of the input bias current sunk by the output stage.

6 Claims, 2 Drawing Sheets

UNITY-GAIN, WIDE BANDWIDTH, BIPOLAR VOLTAGE FOLLOWER WITH A VERY LOW INPUT CURRENT

BACKGROUND OF THE INVENTION

1. Field of the Invention

The present invention relates to unity-gain, wide bandwidth, bipolar voltage-follower circuits and, in particular, to a voltage-follower that utilizes cascode circuitry and cancellation circuitry to provide a very-low input current.

2. Description of the Related Art

A voltage-follower is a circuit that interfaces a high-impedance circuit with a low-impedance load. For unity-gain, wide bandwidth, bipolar voltage-follower applications which require operation very close to ground and a very-low input current (very-high impedance), voltage-followers are commonly designed with PNP input transistor stages and input current cancellation circuitry.

FIG. 1 shows a schematic diagram of a conventional bipolar voltage-follower circuit 10 that illustrates a PNP input transistor stage and input current cancellation circuitry. As shown in FIG. 1, circuit 10 includes an input stage 12 that generates an intermediate voltage signal $V_{INTER}$ and that sources an input base current $I_{BASE1}$ in response to an input voltage signal $V_{INPUT}$ and an input stage bias current $I_{BIAS1}$. The intermediate voltage signal $V_{INTER}$ is equivalent to the input voltage signal $V_{INPUT}$ plus a first offset voltage.

Input stage 12 includes a PNP transistor P1 that has its emitter connected to an intermediate node $N_{INTER}$, its collector connected to ground GND, and its base connected to an input node $N_{INPUT}$. As shown, transistor P1 is biased by the input stage bias current $I_{BIAS1}$ which, in addition to the input voltage signal $V_{INPUT}$, causes the input base current $I_{BASE1}$ to be generated by transistor P1.

Circuit 10 further includes an output stage 14 that generates an output voltage signal $V_{OUT}$ and that sinks a portion of the input stage bias current as an output base current $I_{BASE0}$ in response to the intermediate voltage signal $V_{INTER}$ and an output bias current $I_{BIAS0}$. The output voltage signal $V_{OUT}$ is equivalent to the intermediate voltage signal $V_{INTER}$ minus a second offset voltage.

Output stage 14 includes a NPN transistor Q4 that has its emitter connected to an output node $N_{OUT}$, its collector connected to a power supply Vcc, and its base connected to the intermediate node $N_{INTER}$. As shown, transistor Q4 is biased by the output bias current $I_{BIAS0}$ which, in addition to the intermediate voltage $V_{INTER}$, causes the output base current $I_{BASE0}$ to be sunk from the intermediate node $N_{INTER}$ by transistor Q4.

Transistors P1 and Q4 are both configured to operate as emitter-followers. In an emitter-follower configuration, the voltage at the base of a transistor is reproduced at its emitter plus or minus the voltage across its emitter-base junction, depending on whether a PNP or a NPN transistor is utilized, respectively. Thus, transistor P1 generates the intermediate voltage signal $V_{INTER}$ which is equivalent to the input voltage signal $V_{INPUT}$ plus a first offset voltage which is equivalent to the emitter-base voltage of transistor P1. Similarly, transistor Q4 generates the output voltage $V_{OUT}$ which is equivalent to the intermediate voltage $V_{INTER}$ less a second offset voltage which is equivalent to the base-emitter voltage of transistor Q4.

Thus, the second offset voltage is substantially equivalent to the first offset voltage. This allows the first and second offset voltages to effectively cancel each other out, thereby producing a voltage-follower with substantially no D.C. voltage level shift.

Circuit 10 further includes an input biasing stage 16 that generates the input stage bias current $I_{BIAS1}$ and a tracking bias current $I_{BIAST}$. Input biasing stage 16 includes three substantially identical PNP transistors P2, P3, and P4.

Transistor P4 has its emitter connected to a power supply VCC through a resistor R3, its collector connected to ground GND through a resistor R6, and its base connected to its collector. Transistor P2 has its emitter connected to power supply VCC through a resistor R1, its collector connected to the intermediate node $N_{INTER}$, and its base connected to the collector of transistor P4. Similarly, transistor P3 has its emitter connected to power supply VCC through a resistor R2, its collector connected to a tracking node $N_T$, and its base connected to the collector of transistor P4.

Transistors P2, P3, and P4, and resistors R1, R2, and R3 are configured as a current mirror. As stated above, in a current mirror configuration, the base-emitter voltages of two or more identical transistors are forced to be equal. This in turn forces the collector currents sourced by the two or more transistors to be equal.

P4 is a quasi-diode-connected input device which, along with resistor R6, sets a first fixed current $I_{FIXED1}$. Transistors P2 and P3 are output devices whose collector currents are intended to match the first fixed current $I_{FIXED1}$ flowing through R6. Thus, both the input stage bias current $I_{BIAS1}$ and the tracking bias current $I_{BIAST}$ are substantially equivalent to each other and to the first fixed current $I_{FIXED1}$.

Resistors R1, R2 and R3 establish emitter degeneration. The resistors are equal in value and type and thus match each other precisely, thereby aiding in the accuracy of the current mirror.

Referring again to FIG. 1, circuit 10 additionally includes an output biasing stage 20 that generates the output bias current $I_{BIAS0}$. Output biasing stage 20 includes two substantially identical NPN transistors Q6 and Q7. Transistor Q7 has its emitter connected to ground GND through a resistor R9, its collector connected to power supply VCC through a resistor R11, and its base connected to its collector. Transistor Q7 is configured as a diode which, along with resistor R9, sets a second fixed current $I_{FIXED2}$.

Transistor Q6 has its emitter connected to ground GND through a resistor R8, its collector connected to the output node $N_{OUT}$, and its base connected to the collector of transistor Q7. Resistors R8 and R9 are equal in value and are utilized to improve the matching tolerances between transistors Q6 and Q7. Transistors Q6 and Q7 are also configured as a current mirror. Thus, transistor Q6 sinks output bias current $I_{BIAS0}$ which is substantially equivalent to the second fixed current $I_{FIXED2}$.

Circuit 10 further includes a cancellation stage 22 that sinks substantially all of the input base current $I_{BASE1}$ in response to the tracking bias current $I_{BIAST}$. Cancellation stage 22 includes three NPN transistors P5, Q1 and Q2. Transistor P5 has its emitter connected to the tracking node $N_T$, its collector connected to ground GND, and its base connected to a third node $N_3$. In addition, transistor P5 is formed to substantially match transistor P1.

Transistor Q2 has its emitter connected to ground GND through a resistor R5, it collector connected to the third node $N_3$, and its base connected to its collector. Transistor Q1 is configured to match transistor Q2 and has its emitter connected to ground GND through a resistor R4, its collector connected to the base of transistor P1, and its base connected to the base of transistor Q2. Resistors R4 and R5 are substantially identical and are utilized to improve the matching tolerances between transistors Q1 and Q2.

Transistor Q2, which is configured as a diode, sets a tracking bias voltage $V_{TB}$ at the base of transistor P5. As stated above, since the tracking bias current $I_{BIAST}$ is substantially equivalent to the input stage bias current $I_{BIAS1}$, transistors P5 and P1 are biased by substantially equivalent currents. Further, since transistors P5 and P1 are substantially equivalent, transistor P5 sources a tracking base current $I_{BASET}$ that is substantially equivalent to the input base current $I_{BASET}$ In operation, the tracking base current $I_{BASET}$ flows into the collector of transistor Q2 and into the bases of transistors Q1 and Q2. Transistors Q1 and Q2, which are substantially identical, are configured as a current mirror. Since the base current sunk by transistors Q1 and Q2 is very small (transistors Q1 and Q2 are NPN transistors with a relatively high beta), the collector current of transistor Q2 is substantially equivalent to the tracking base current $I_{BASET}$. Thus, transistor Q1 sinks a cancellation current $I_{CAN}$ which is substantially equivalent to the tracking base current $I_{BASET}$. Therefore, since the cancellation current $I_{CAN}$ sunk by transistor Q1 is substantially equivalent to the tracking base current $I_{BASET}$ sourced by transistor P5, and since the tracking base current $I_{BASET}$ is substantially equivalent to the input base current $I_{BASE1}$ sourced by transistor P1 (the tracking base current $I_{BASET}$ does not account for very slight variations in the input base current $I_{BASE1}$ that result from variations of the input voltage signal $V_{INPUT}$), then the cancellation current $I_{CAN}$ sunk by transistor Q1 is substantially equivalent to the input base current $I_{BASE1}$ sourced by transistor P1. Therefore, cancellation stage 22 sinks substantially all of the input base current $I_{BASE1}$.

As shown in FIB. 1, circuit 10 further includes a compensation stage 24 that sinks a portion of the tracking bias current $I_{BIAST}$ as a compensation base current $I_{BASEC}$. The portion of the tracking bias current $I_{BIAST}$ sunk by compensation stage 24 is substantially equivalent to the portion of the input stage bias current $I_{BIAS1}$ sunk by output stage 14.

Compensation stage 24 includes two NPN transistors Q3 and Q5. Transistor Q5 has its emitter connected to ground GND through a resistor R7, its collector connected to a fourth node $N_4$, and its base connected to the base of transistor Q6. Transistor Q3 has its emitter connected to the fourth node $N_4$, its collector connected to power supply VCC, and its base connected to the emitter of transistor P5.

Transistor Q5, along with transistors Q6 and Q7, is connected as a current mirror. Transistor Q5 sinks a compensation collector current $I_{CC}$ that is substantially equivalent to the output bias current $I_{BIAS0}$. Thus, transistors Q3 and Q4 are substantially equivalently biased. Therefore, transistors Q3 and Q4 sink a substantially equivalent base current.

One problem with circuit 10 is the flucuation of the input stage bias current $I_{BIAS1}$ in response to the input voltage signal $V_{INPUT}$. When the input voltage signal $V_{INPUT}$ varies, the intermediate voltage signal $V_{INTER}$ and the collector voltage of transistor P2 correspondingly vary. As a result of its finite output impedance, the collector current of transistor P2 varies with the collector voltage and thus so would the magnitude of the input stage bias current $I_{BIAS1}$.

On the other hand, since the collector of transistor P3 is not connected to the emitter of transistor P1, the collector voltage of transistor P3, and therefore the tracking bias current $I_{BIAST}$, does not vary. Therefore, the tracking bias current $I_{BIAST}$ and the input stage bias current $I_{BIAS1}$ are no longer substantially equivalent. Thus, there is a need for a circuit which can reduce the flucuations of the input stage bias current $I_{BIAS1}$ when the input voltage signal $V_{INPUT}$ varies.

Another problem with circuit 10 is the increased emitter current, and thereby base current, sourced by transistor Q4 as a result of a variably resistive load. When a resistive load is connected to the output node $N_{OUTPUT}$, the total current in the emitter of transistor Q4 is the sum of the output bias current $I_{BIAS0}$ and the current sunk by the resistive load. Since the current in the emitter of transistor Q3 mirrors only the output bias current $I_{BIAS0}$, the additional base current sunk by transistor Q4 as a result of the resistive load is not accounted for. Thus, there is a need for a circuit which can account for the additional current sunk as a result of a resistive load.

SUMMARY OF THE INVENTION

The present invention provides a unity-gain, wide bandwidth, bipolar voltage-follower that utilizes cascode circuitry and cancellation circuitry to provide a very-low input current.

A bipolar voltage-follower in accordance with the present invention includes an input biasing stage that generates an input stage bias current and a tracking bias current. The input stage bias current and the tracking bias current are substantially equivalent. An input stage generates an intermediate voltage signal and sources an input base current in response to an input voltage signal and the input stage bias current. The intermediate voltage signal is equivalent to the input voltage signal plus a first offset voltage. An output biasing stage sinks an output bias current. An output stage generates an output voltage signal and sinks a portion of the input bias current and an output collector current in response to the intermediate voltage signal and the output bias current. The output voltage signal is equivalent to the intermediate voltage signal minus a second offset voltage. A cancellation stage sinks substantially all of the input base current in response to the tracking bias current. A compensation stage sinks a portion of the tracking bias current in response to the output collector current. The portion of the tracking bias current sunk by the compensation stage is substantially equivalent to the portion of the input bias current sunk by the output stage.

The voltage-follower further comprises a cascode stage that isolates the input biasing stage from the input stage and the cancellation stage so that the input biasing stage can generate a substantially constant input stage bias current and a substantially constant tracking bias current largely independent of the input voltage signal.

A better understanding of the features and advantages of the present invention will be obtained by reference to the following detailed description and accompanying drawings which set forth an illustrative embodiment in which the principles of the invention are utilized.

DETAILED DESCRIPTION

Figure 1:
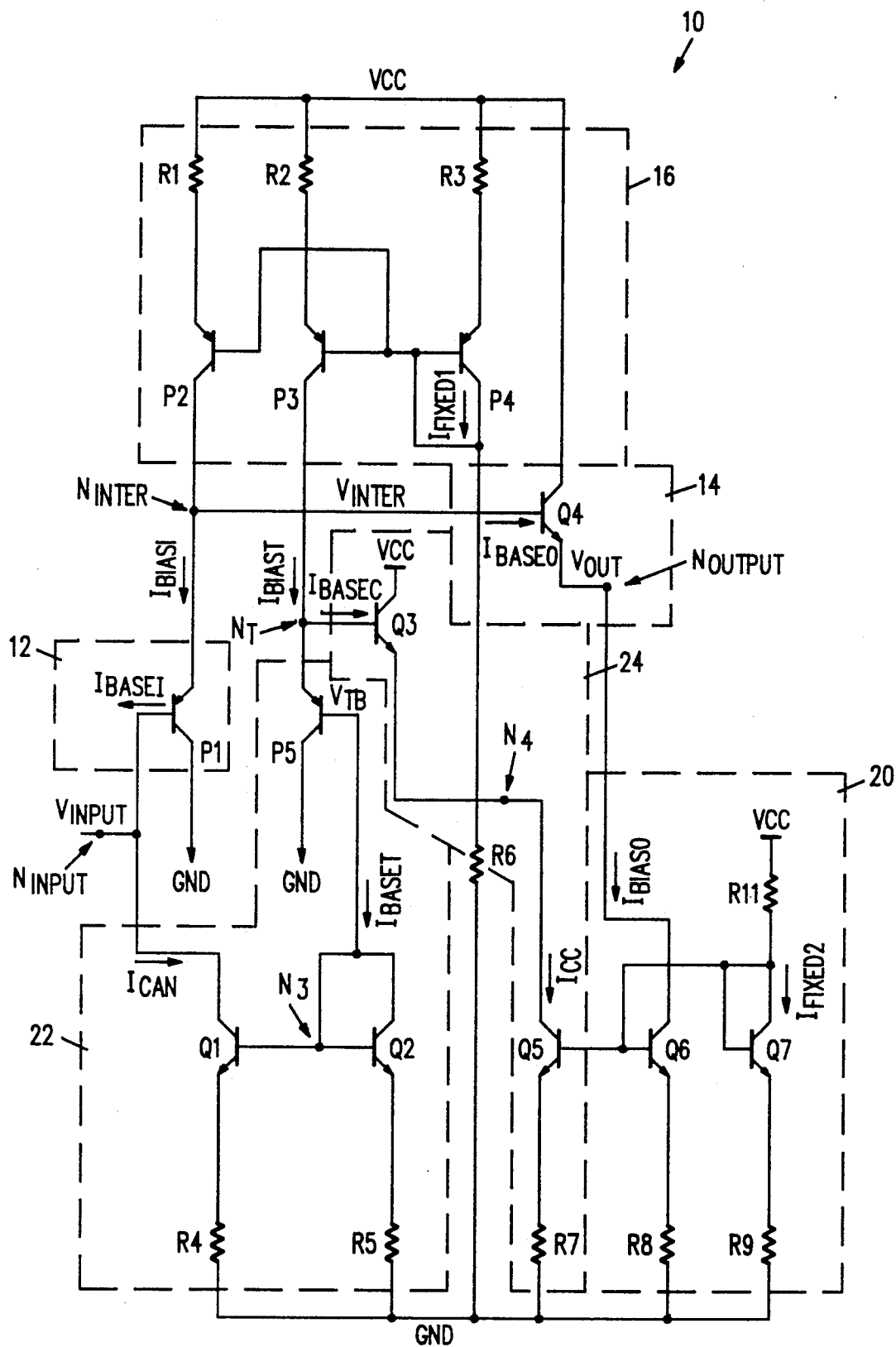
FIG. 1 shows a schematic diagram of a conventional bipolar voltage-follower circuit 10 that illustrates a PNP input transistor stage and input current cancellation circuitry.
Figure 2:
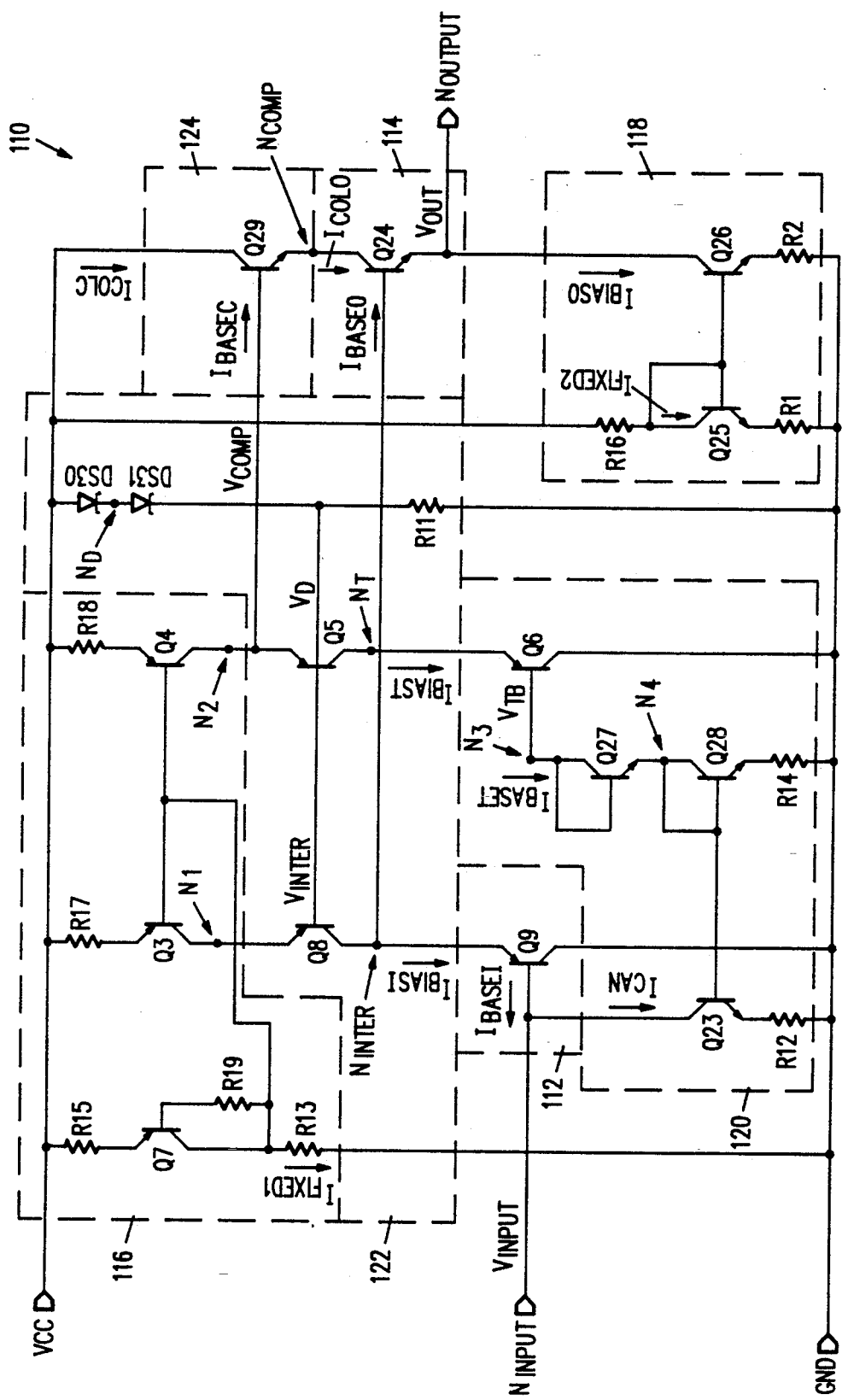
FIG. 2 shows a schematic diagram of a unity-gain, high bandwidth, bipolar voltage-follower circuit 110 in accordance with the present invention.

FIG. 2 shows a schematic diagram of a unity-gain, high bandwidth, bipolar voltage-follower circuit 110 in accordance with the present invention. As described in greater detail below, circuit 110 utilizes cascode circuitry and compensation circuitry to provide a very-low input current.

As shown in FIG. 2 and as shown in the prior art, circuit 110 includes an input stage 112, an output stage 114, an input biasing stage 116, an output biasing stage 118, and a cancellation stage 120.

As stated above, input stage 112 generates an intermediate voltage signal $V_{INTER}$ and sources an input base current $I_{BASE1}$ in response to an input voltage signal $V_{INPUT}$ and an input stage bias current $I_{BIAS1}$. The intermediate voltage signal $V_{INTER}$ is equivalent to the input voltage signal $V_{INPUT}$ plus a first offset voltage.

Input stage 112 includes a PNP transistor Q9 that has its emitter connected to an intermediate node $N_{INTER}$, its collector connected to ground GND, and its base connected to an input node $N_{INPUT}$. As shown, transistor Q9 is biased by the input stage bias current $I_{BIAS1}$ which, in addition to the input voltage signal $V_{INPUT}$, causes the input base current $I_{BASE1}$ to be generated by transistor Q9.

As also stated above, output stage 114 generates an output voltage signal $V_{OUT}$ and sinks a portion of the input stage bias current as an output base current $I_{BASE0}$ in response to the intermediate voltage signal $V_{INTER}$ and an output bias current $I_{BIAS0}$. In addition, in the present invention, output stage 114 also sinks an output collector current $I_{COL0}$ in response to the intermediate voltage signal $V_{INTER}$ and the output bias current $I_{BIAS0}$. The output voltage signal $V_{OUT}$ is equivalent to the intermediate voltage signal $V_{INTER}$ minus a second offset voltage.

Output stage 114 includes a NPN transistor Q24 that has its emitter connected to an output node $N_{OUT}$, its collector connected to a compensation node $N_{COMP}$, and its base connected to the intermediate node $N_{INTER}$. As shown, transistor Q24 is biased by the output bias current $I_{BIAS0}$ which, in addition to the intermediate voltage $V_{INTER}$, causes the output base current $I_{BASE0}$ to be sunk from the intermediate node $N_{INTER}$ by transistor Q24.

Transistors Q9 and Q24 are both configured to operate as emitter-followers. In an emitter-follower configuration, the voltage at the base of a transistor is reproduced at its emitter plus or minus the voltage across its emitter-base junction, depending on whether a PNP or a NPN transistor is utilized, respectively. Thus, transistor Q9 generates the intermediate voltage signal $V_{INTER}$ which is equivalent to the input voltage signal $V_{INPUT}$ plus a first offset voltage which is equivalent to the emitter-base voltage of transistor Q9. Similarly, transistor Q24 generates the output voltage $V_{OUT}$ which is equivalent to the intermediate voltage $V_{INTER}$ less a second offset voltage which is equivalent to the base-emitter voltage of transistor Q24.

Thus, the second offset voltage is substantially equivalent to the first offset voltage. This allows the first and second offset voltages to effectively cancel each other out, thereby producing a voltage-follower with substantially no D.C. level shift.

As further stated above, input biasing stage 116 generates the input stage bias current $I_{BIAS1}$ and a tracking bias current $I_{BIAST}$. Input biasing stage 116 includes three substantially identical PNP transistors Q7, Q3, and Q4.

Transistor Q7 has its emitter connected to a power supply VCC through a resistor R15, its collector connected to ground GND through a resistor R13, and its base connected to its collector through a resistor R19. Transistor Q3 has its emitter connected to power supply VCC through a resistor R17, its collector connected to a first node $N_1$, and its base connected to the collector of transistor Q7. Similarly, transistor Q4 has its emitter connected to power supply VCC through a resistor R18, its collector connected to a second node $N_2$, and its base connected to the collector of transistor Q7.

Transistors Q3, Q4, and Q7, and resistors R15, R17, R18 and R19 are configured as a current mirror with first-order base current compensation. As stated above, in a current mirror configuration, the base-emitter voltages of two or more identical transistors are forced to be equal. This in turn forces the collector currents sourced by the two or more transistors to be equal.

Q7 is a quasi-diode-connected input device which, along with resistor R13, sets a first fixed current $I_{FIXED1}$. Transistors Q3 and Q4 are output devices whose collector currents are intended to match the first fixed current $I_{FIXED1}$ flowing through R13. Thus, both the input stage bias current $I_{BIAS1}$ and the tracking bias current $I_{BIAST}$ are substantially equivalent to each other and to the first fixed current $I_{FIXED1}$.

Resistors R15, R17 and R18 establish emitter degeneration. The resistors are equal in value and type and thus match each other precisely, thereby aiding in the accuracy of the current mirror. Resistor R19 degenerates the base of transistor Q7 and functions to produce first-order compensation for the base current under low beta conditions. This is well-known in the art. In addition, other schemes also exist to maintain current mirror accuracy under low beta (relatively high base current) conditions.

As additionally stated above, output biasing stage 118 generates the output bias current $I_{BIAS0}$. Output biasing stage 118 includes two substantially identical NPN transistors Q25 and Q26. Transistor Q25 has its emitter connected to ground GND through a resistor R1, its collector connected to power supply VCC through a resistor R16, and its base connected to its collector. Transistor Q25 is configured as a diode which, along with resistor R16, sets a second fixed current $I_{FIXED2}$. Resistors R1 and R2 are equal in value and are utilized to improve the matching tolerances between transistors Q25 and Q26.

Transistor Q26 has its emitter connected to ground GND through a resistor R2, its collector connected to the output node $N_{OUT}$, and its base connected to the collector of transistor Q25. Transistors Q25 and Q26 are also configured as a current mirror. Thus, transistor Q26 sinks output bias current $I_{BIAS0}$ which is substantially equivalent to second fixed current $I_{FIXED2}$.

As also stated above, cancellation stage 120 sinks substantially all of the input base current $I_{BASE1}$ in response to the tracking bias current $I_{BIAST}$. Cancellation stage 120 includes one PNP transistor Q6 and three NPN transistors Q27, Q28, and Q23. Transistor Q6 has its emitter connected to the tracking node $N_T$, its collector connected to ground GND, and its base connected to a third node $N_3$. In addition, transistor Q6 is formed to substantially match transistor Q9.

Transistor Q27 has its emitter connected to a fourth node $N_4$, its collector connected to the third node $N_3$, and its base connected to its collector. Transistor Q28 has its emitter connected to ground GND through a resistor R14, it collector connected to the fourth node $N_4$, and its base connected to its collector. Transistor Q23 is configured to match transistor Q28 and has its emitter connected to ground GND through a resistor R12, its collector connected to the base of transistor Q9, and its base connected to the base of transistor Q28. Resistors R12 and R14 are substantially identical and are utilized to improve the matching tolerances between transistors Q22 and Q28.

Transistors Q27 and Q28, both of which are configured as diodes, form a diode stack that sets a tracking bias voltage $V_{TB}$ at the base of transistor Q6. In the preferred embodiment, the tracking bias voltage is set at approximately 1.4 volts (the approximate equivalent of two base-emitter voltage drops). Further, the input voltage signal $V_{INPUT}$ ranges from approximately 0.8 to 2.2 volts. Thus, by setting the base voltage of transistor Q6 at 1.4 volts, the base of transistor Q6 is set at approximately the mid-range of the expected input voltage signals $V_{INPUT}$. Alternately, the tracking bias voltage $V_{TB}$ can be set at other voltages by removing transistor Q27, adding additional transistors to the diode stack, or utilizing other well-known circuit elements.

As stated above, since the tracking bias current $I_{BIAST}$ is substantially equivalent to the input stage bias current $I_{BIAS1}$, transistors Q6 and Q9 are biased by substantially equivalent currents. Further, since transistor Q6 and Q9 are substantially equivalent and since the tracking bias voltage $V_{TB}$ is equivalent to the midrange of expected input voltage signals, transistor Q6 sources a tracking base current $I_{BASKET}$ that is substantially equivalent to the input base current $I_{BASE1}$.

In operation, the tracking base current $I_{BASKET}$ flows into the collector of transistor Q28 and into the bases of transistors Q27 and Q28. Transistors Q28 and Q23, which are substantially identical, are configured as a current mirror. Since the base current sunk by transistors Q28 and Q23 is very small (transistors Q28 and Q23 are NPN transistors with a relatively high beta), the collector current of transistor Q28 is substantially equivalent to the tracking base current $I_{BASET}$. Thus, transistor Q23 sinks a cancellation current $I_{CAN}$ which is substantially equivalent to the tracking base current Therefore, since the cancellation current $I_{CAN}$ sunk by transistor Q23 is substantially equivalent to the tracking base current $I_{BASET}$ sourced by transistor Q6, and since the tracking base current $I_{BASET}$ is substantially equivalent to the input base current $I_{BASE1}$ sourced by transistor Q9 (the tracking base current $I_{BASET}$ does not account for very slight variations in the input base current $I_{BASE1}$ that result from variations of the input voltage signal $V_{INPUT}$), then the cancellation current $I_{CAN}$ sunk by transistor Q23 is substantially equivalent to the input base current $I_{BASE1}$ sourced by transistor Q9. Therefore, cancellation stage 22 sinks substantially all of the input base current $I_{BASE1}$.

With continuing reference to FIG. 2, in the present invention, circuit 10 also includes a cascode stage 122 that generates a compensation bias voltage $V_{COMP}$ and that isolates the input biasing stage 116 from the input stage 112 and from the cancellation stage 120. Cascode stage 122 includes two substantially identical PNP transistors Q8 and Q5 and two diodes DS30 and DS31.

Transistor Q8 has its emitter connected to the first node $N_1$, its collector connected to the intermediate node $N_{INTER}$, and its base connected to the cathode of diode DS31. Similarly, transistor Q5 has its emitter connected to the second node $N_2$, its collector connected to the tracking node $N_T$, and its base connected to the cathode of diode DS31.

Diodes DS30 and DS31 are utilized to provide a diode bias voltage $V_D$ to the bases of transistors Q8 and Q5. Diode bias voltage $V_D$ is utilized to set a voltage which prevents both transistors Q3 and Q4 and transistors Q8 and Q5 from saturating and to provide the compensation bias voltage $V_{COMP}$ at the emitter of transistor Q5. Diode DS30 has its anode connected to power supply VCC and its cathode connected to a diode node $N_D$. Diode DS31 has its anode connected to the diode node $N_D$ and its cathode connected to ground GND through a resistor R11. Resistor R11 sets a nominal current that biases diodes DS30 and DS31 to produce a fixed known value of diode bias voltage $V_D$. In the preferred embodiment of the present invention, Schottky diodes are utilized for diodes DS30 and DS31 so that a minimum two-diode voltage drop can be obtained. Alternately, other well-known circuit elements can be utilized to obtain the diode bias voltage $V_D$.

As described, transistors Q8 and Q5 are connected in a conventional cascode configuration. In a cascode configuration, a transistor is utilized to isolate a current sourcing transistor from voltage fluctuations at its collector which, as described below, produce current fluctuations.

For example, as stated above, when the input voltage signal $V_{INPUT}$ varies, the intermediate voltage signal $V_{INTER}$ correspondingly varies. Without the presence of transistor Q8, as when the collector of transistor Q3 is connected to the emitter of transistor Q9, the collector voltage of transistor Q3 would also correspondingly vary. As a result of its finite output impedance, the collector current of transistor Q3 would vary with the collection voltage and thus so would the magnitude of the input stage bias current $I_{BIAS1}$.

On the other hand, since the collector of transistor Q4 is not connected to the emitter of transistor Q9, the collector voltage of transistor Q4, and therefore the tracking bias current $I_{BIAST}$, does not vary. Therefore, without transistor Q8, the tracking bias current $I_{BIAST}$ and the input stage bias current $I_{BIAS1}$ are no longer substantially equivalent.

With the inclusion of transistor Q8, and the inclusion of transistor Q5 to maintain symmetry, when the input voltage signal $V_{INPUT}$ varies, the collector voltage of transistor Q8 correspondingly varies. However, when the input voltage signal $V_{INPUT}$ varies, the emitter voltage of transistor Q8, and thus the collector voltage of transistor Q3, only varies slightly. Since the voltage variation at the collector of transistor Q3 is substantially reduced, the input stage bias current $I_{BIAS1}$ sourced by transistor Q3 remains substantially constant. Therefore, by utilizing transistors Q8 and Q5 in the cascode configuration, the input stage bias current $I_{BIAS}$ and the tracking bias current $I_{BIAST}$ remain substantially constant and substantially equivalent when the input voltage signal $V_{INPUT}$ varies within its expected input range.

Although cascode stage 118 has been described by utilizing transistors Q8 and Q5 and diodes DS30 and DS31, other well-known circuitry for sourcing a substantially constant and substantially equivalent input stage bias current and tracking bias current can also be used.

As shown in FIG. 2, circuit 110 further includes a compensation stage 124 that both sinks a portion of the tracking bias current $I_{BIAST}$ as a compensation base current $I_{BASEC}$ and sinks a compensation collector current $I_{COLC}$ in response to the output collector current $I_{COLO}$. The compensation bias voltage $V_{COMP}$ biases transistor Q29 in the active mode. In the present invention, the portion of the tracking bias current $I_{BIAST}$ sunk by compensation stage 124 is substantially equivalent to the portion of the input stage bias current $I_{BIAS1}$ sunk by output stage 114.

Compensation stage 124 includes a NPN transistor Q29. Transistor Q29 has its emitter connected to the compensation node $N_{COMP}$, its collector connected to power supply VCC, and its base connected to the emitter of transistor Q5.

In operation, transistor Q29 sinks the compensation base current $I_{BASEC}$ and the compensation collector current $I_{COLC}$ in response to the output collector current $I_{COLO}$. Since transistor Q24 is a NPN transistor, which typically has a beta on the order of 100, substantially all of the output bias current $I_{BIASO}$ sourced by transistor Q26 is sunk by transistor Q24 as output collector current $I_{COLO}$. Thus, transistors Q24 and Q29 are biased to a substantially equivalent degree, thereby operating in a substantially equivalent manner. Therefore, the base current sunk by transistor Q29 is also substantially equivalent to the base current sunk by transistor Q24. The advantage of sinking a portion of the tracking bias current $I_{BIAST}$ which is substantially equivalent to the portion of the input stage bias current $I_{BIAS1}$ sunk by output stage 114 is that tracking bias current $I_{BIAST}$ and input stage bias current $I_{BIAS1}$ remain substantially equivalent.

Although compensation stage 124 corrects for a relatively small error between the two bias currents $I_{BIAST}$ and $I_{BIAS1}$ (transistor Q24 is a NPN transistor with a relatively high beta), compensation stage 124 also allows circuit 110 to be connected to a variably resistive load. A variably resistive load will sink a variable current from the emitter of transistor Q24, which in turn will vary the base current sunk by transistor Q24, thereby increasing the error between the two bias currents $I_{BIAST}$ and $I_{BIAS1}$. Since the collector current sunk by transistor Q24 will also vary, the base current sunk by transistor Q29 will vary correspondingly. Thus, the two bias currents $I_{BIAST}$ and $I_{BIAS1}$ will vary substantially equally.

Based on the above, it would appear that transistor Q29 would function equally well with its base connected to the collector of either transistor Q4 or Q5. However, to insure that the collector-base junction of transistor Q24 remains forward biased for the entire range of input voltage signals, the base of transistor Q29 is connected to the collector of transistor Q4.

As described above, the bases of both transistors Q8 and Q5 are biased at approximately 3.9 volts by the voltage drops associated with diodes DS30 and DS31, assuming the power supply Vcc is equal to 5V. The base of transistor Q29 is biased at approximately 4.6 volts as a result of the emitter-base voltage of transistor Q5. Thus, the collector of transistor Q24 is biased at approximately 3.9 volts as a result of the base-emitter voltage drop of transistor Q29.

As stated earlier, the expected range of input voltage signals $V_{INPUT}$ in the preferred embodiment is approximately 0.8 to 2.2 volts. Thus, the maximum voltage at the intermediate node $N_{INTER}$, and therefore the base of transistor Q24, is approximately 2.9 volts (2.2 volts plus the emitter-base voltage gain of transistor Q9). Therefore, the collector-base junction of transmitter Q24 will remain reverse-biased in response to the expected range of input voltage signals $V_{INPUT}$.

It should be understood that various alternatives to the structures described herein may be employed in practicing the present invention. It is intended that the following claims define the invention and that structures within the scope of these claims and their equivalents be covered thereby.

What is claimed is:

1. A voltage-follower circuit comprising:
    an input biasing stage that generates an input stage bias current and a tracking bias current, the input stage bias current and the tracking bias current being substantially equivalent;
    an input stage that generates an intermediate voltage signal and that sources an input base current in response to an input voltage signal and the input stage bias current, the intermediate voltage signal being equivalent to the input voltage signal plus a first offset voltage;
    an output biasing stage that sinks an output bias current;
    an output stage that generates an output voltage signal and that sinks a portion of the input stage bias current and an output collector current in response to the intermediate voltage signal and the output bias current, the output voltage signal being equivalent to the intermediate voltage signal minus a second offset voltage;
    a cancellation stage that sinks substantially all of the input base current in response to the tracking bias current; and
    a compensation stage connected between the output stage and a power supply that sinks a portion of the tracking bias current in response to the output collector current, the portion of the tracking bias current sunk by the compensation stage being substantially equivalent to the portion of the input stage bias current sunk by the output stage.

2. The circuit of claim 1 and further comprising a cascode stage connected between the input biasing stage and both the input stage and the compensation stage that isolates the input biasing stage from the input stage and the cancellation stage so that the input biasing stage can generate a substantially constant input stage bias current and a substantially constant tracking bias current largely independent of the input voltage signal.

3. The circuit of claim 2 wherein the second offset voltage is substantially equivalent to the first offset voltage.

4. A method for providing a very-low input current in a bipolar voltage-follower, the method comprising the steps of:

generating a substantially constant input stage bias current and a substantially constant tracking bias current, the input stage bias current and the tracking bias current being substantially equivalent;

generating an intermediate voltage signal and sourcing an input base current in response to an input voltage signal and the input stage bias current, the intermediate voltage signal being equivalent to the input voltage signal plus a first offset voltage;

sinking an output bias current;

generating an output voltage signal and sinking a portion of the input stage bias current and an output collector current in response to the intermediate voltage signal and the output bias current, the output voltage signal being equivalent to the intermediate voltage signal minus a second offset voltage;

sinking substantially all of the input base current in response to the tracking bias current; and sinking a portion of the tracking bias current in response to the output collector current, the portion of the tracking bias current sunk being substantially equivalent to the portion of the input stage bias current sunk.

5. A voltage-follower circuit comprising:

input biasing means for generating an input stage bias current and a tracking bias current, the input stage bias current and the tracking bias current being substantially equivalent;

input means for generating an intermediate voltage signal and for generating an input base current in response to an input voltage signal and the input stage bias current, the intermediate voltage signal being equivalent to the input voltage signal plus a first offset voltage;

output biasing means for sinking an output bias current;

output means for generating an output voltage signal and for sinking a portion of the input stage bias current and an output collector current in response to the intermediate voltage signal and the output bias current the output voltage signal being equivalent to the intermediate voltage signal minus a second offset voltage;

cancellation means for sinking substantially all of the input base current in response to the tracking bias current; and compensation means for sinking a portion of the tracking bias current in response to the output collector current, the portion of the tracking bias current sunk by the compensation means being substantially equivalent to the portion of the input stage bias current sunk by the output means.

6. The circuit of claim 5 and further comprising cascode means for isolating the input biasing means from the input means and the cancellation means so that the input biasing means can generate a substantially constant input stage bias current and a substantially constant tracking bias current largely independent of the input voltage signal.

* * * * *